United States Patent
Ishida

(10) Patent No.: US 7,766,712 B2
(45) Date of Patent: *Aug. 3, 2010

(54) METHOD FOR FABRICATING ORGANIC ELECTROLUMINESCENT DISPLAY AND FABRICATION APPARATUS USED IN THE METHOD

(75) Inventor: Kazuya Ishida, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 764 days.

This patent is subject to a terminal disclaimer.

(21) Appl. No.: 11/552,598

(22) Filed: Oct. 25, 2006

(65) Prior Publication Data

US 2007/0093167 A1  Apr. 26, 2007

(30) Foreign Application Priority Data

Oct. 25, 2005  (JP) .............................. 2005-309979

(51) Int. Cl.
    *H01J 9/24*  (2006.01)
(52) U.S. Cl. .......................................... 445/23; 445/60
(58) Field of Classification Search ............. 445/23–24, 445/60
    See application file for complete search history.

(56) References Cited

U.S. PATENT DOCUMENTS

| | | | |
|---|---|---|---|
| 6,566,032 B1 * | 5/2003 | Boroson et al. ............. | 430/200 |
| 6,583,557 B2 | 6/2003 | Hashimoto et al. | |
| 6,735,830 B1 * | 5/2004 | Merciel ....................... | 250/324 |
| 6,863,961 B2 | 3/2005 | Miyashita et al. | |
| 7,095,170 B2 | 8/2006 | Matsuki et al. | |
| 7,129,637 B2 | 10/2006 | Nakayama | |
| 2002/0187272 A1 | 12/2002 | Kojima et al. | |
| 2003/0175414 A1 | 9/2003 | Hayashi | |
| 2003/0207500 A1 * | 11/2003 | Pichler et al. ................ | 438/127 |
| 2004/0027777 A1 * | 2/2004 | Komoriya et al. ........... | 361/212 |
| 2004/0087068 A1 | 5/2004 | Yudasaka | |
| 2004/0131501 A1 * | 7/2004 | Maruo et al. .................. | 422/91 |

FOREIGN PATENT DOCUMENTS

| | | |
|---|---|---|
| JP | 08-096955 A | 4/1996 |
| JP | 10-012377 A | 1/1998 |
| JP | 10-153967 A | 6/1998 |
| JP | 10-241858 A | 9/1998 |
| JP | 11-121172 A | 4/1999 |
| JP | 2001-223077 A | 8/2001 |
| JP | 2003-77655 A | 3/2003 |
| JP | 2003-217840 A | 7/2003 |
| JP | 2004-141721 A | 5/2004 |
| JP | 2004-337772 A | 12/2004 |
| JP | 2004-362854 A | 12/2004 |
| JP | 2005-135734 A | 5/2005 |
| JP | 2006-120382 A | 5/2006 |
| KR | 1020040006540 A * | 1/2004 |

* cited by examiner

*Primary Examiner*—Toan Ton
*Assistant Examiner*—Hana A Sanei
(74) *Attorney, Agent, or Firm*—Keating & Bennett, LLP

(57) ABSTRACT

An organic EL light emitting layer is formed in a housing including an air atmosphere having a lower moisture concentration than that of the ambient atmosphere and a lower ozone concentration than that of the ambient atmosphere.

18 Claims, 4 Drawing Sheets

METHOD FOR FABRICATING ORGANIC ELECTROLUMINESCENT DISPLAY AND FABRICATION APPARATUS USED IN THE METHOD

BACKGROUND OF THE INVENTION

1. Field of the Invention

The present invention relates to a method for fabricating an organic electroluminescent display and a fabrication apparatus used in the method.

2. Description of the Related Art

Organic electroluminescent displays (which will be hereafter occasionally referred to as "organic EL displays") can be operated at a low driving voltage and have an excellent fast-response property. Moreover, organic electroluminescent displays are self-luminous displays and have a wide viewing angle. Therefore, organic electroluminescent displays are largely expected to be a next generation flat panel display and there has been increased development for various kinds of organic EL displays and fabrication methods which allow mass production for organic EL displays.

An organic EL display includes an organic electroluminescent layer (which will be occasionally referred to as an "organic EL layer") having a single-layer or multi-layer structure including at least an organic electroluminescent light emitting layer (which will be hereafter occasionally referred to as an "organic EL light emitting layer"), a cathode, and an anode for holding the organic EL layer therebetween. The cathode injects electrons into the organic EL light emitting layer and the anode injects holes (positive holes) into the organic EL light emitting layer. In the organic EL light emitting layer, electrons and holes injected by the cathode and the anode, respectively, recombine to form excitons. Then, when the formed excitons are devitalized, light is emitted from the organic EL light emitting layer. Utilizing this light emission, the organic EL display displays letters, images, and the like.

Such organic EL displays are largely divided into two kinds depending on the type of the organic EL layer. Specifically, they are largely divided into two types of the organic EL layers, i.e., high molecular organic EL displays including an organic EL layer containing a high molecular organic electroluminescent material (which will be hereafter occasionally referred to as a "high molecular organic EL material") and low molecular organic EL displays including an EL layer containing a low molecular organic electroluminescent material. In the case of a low molecular organic EL display, the organic EL layer is normally formed by a dry method such as vapor deposition or the like. On the other hand, in the case of a high molecular organic EL display, the organic EL layer is formed by wet processing such as print processing, an inkjet method (see e.g., Japanese Laid-Open Publication No. 10-12377 (Patent Reference 1) and U.S. Pat. No. 6,863,961 (Patent Reference 2), or the like).

In general, the organic EL material contained in the organic EL layer has a characteristic that it deteriorates very easily in an ambient atmosphere. Therefore, when the organic EL layer is formed in the ambient atmosphere, the organic EL material deteriorates in process steps for forming the organic EL layer, thus resulting in the problem in which innate characteristics of the organic EL layer cannot be achieved. Note that "characteristics of the organic EL layer" mean luminous brightness, luminous efficiency, brightness half-life, luminous life, and the like of the organic EL layer.

In view of the above-described problems, various techniques for controlling the fabrication atmosphere used in the process steps for forming the organic EL display including the process step of forming the organic EL layer have been disclosed. For example, in Japanese Laid-Open Publication No. 10-241858 (Patent Reference 3), a technique is disclosed including the process step of transferring an organic electroluminescent lamination structure formed in the process step of forming an organic electroluminescent lamination structure so that the organic electroluminescent lamination structure is not exposed to the atmosphere up to the process step of providing a shield member in vacuum or an inert gas atmosphere having a water content of 100 ppm or less.

In Japanese Laid-Open Publication No. 2003-77655 (Patent Reference 4), a technique is disclosed characterized in that process steps from an initial process step of forming an organic layer to the process step of forming a sealing portion are performed in an atmosphere (having a water concentration of 0.21 mg/l or less) of which a water volume is limited. Also, in U.S. Patent Application Publication No. 2003/175414 (Patent Reference 5), a technique is disclosed in which the process step of discharging a luminous function material is performed in an inert gas atmosphere (having a moisture concentration of 10 ppm or less).

Using techniques described in Patent References 3 through 5, deterioration of the high molecular organic EL material in the process step of forming the organic EL layer can be minimized. Thus, an organic EL display having excellent properties can be fabricated.

However, as in the methods disclosed in Patent References 3 through 5, when the organic EL layer is formed in an atmosphere in which oxygen and water are not substantially contained, for example, in a vacuum atmosphere and an inert gas atmosphere, the process step of forming the organic EL layer needs to be performed in a closed space such as a globe box and the like. In experimental and trial stages of production, the organic EL layer can be formed in a globe box, but in a mass production process step, it is difficult to form the organic EL layer in a globe box in terms of production costs.

SUMMARY OF THE INVENTION

In order to overcome the problems described above, preferred embodiments of the present invention provide a method for fabricating an organic EL display having high luminous efficiency and long production-life at low cost and with high production efficiency.

In known techniques, it has been considered to be a major cause of not being able to achieve innate characteristics of the organic EL layer when the organic EL layer is formed in an atmosphere that the organic EL material is in contact with oxygen and moisture. Thus, as described above, the organic EL layer is normally formed in vacuum or an inert gas atmosphere having a very small water content, i.e., a water content of 100 ppm or less.

As a result of diligent studies, however, the present inventor discovered that a major cause of deterioration of the organic EL material is moisture and ozone. That is, the present inventor discovered that, if both of a moisture concentration and an ozone concentration are low, even in an atmosphere containing oxygen, the organic EL layer having a relatively high light property can be formed.

Moreover, the present inventor discovered that a moisture concentration in the atmosphere in which the organic EL layer is formed and deterioration of the organic EL material do not exhibit a linear correlation. That is, it was discovered that at a moisture concentration equal to or lower than a predetermined level, an organic EL layer having a relatively high light property can be formed, and the organic EL layer does not have to be formed in the atmosphere (for example, the dry nitrogen atmosphere) which does not substantially contain moisture. Likewise, an ozone concentration in the atmosphere in which the organic EL layer is formed and deterioration of the organic EL material do not exhibit a linear correlation. That is, it was discovered that at an ozone concentration equal to or lower than a predetermined level, an organic EL layer having a relatively high light property can be formed, and the organic EL layer does not have to be formed in the atmosphere (for example, the dry nitrogen atmosphere) which does not substantially contain ozone.

As a result, the present inventor discovered that it is possible to form an organic EL layer having a high light property even in an air atmosphere in which both of a moisture concentration and an ozone concentration are adjusted.

Specifically, a fabrication method according to a preferred embodiment of the present invention is a method for fabricating an organic electroluminescent display including an organic electroluminescent light emitting layer (for example, a high molecular organic electroluminescent light emitting layer) provided between a pair of electrodes, and the method includes the step of forming the organic electroluminescent light emitting layer in a housing including an air atmosphere having a lower moisture concentration than that of an ambient atmosphere and a lower ozone concentration than that of the ambient atmosphere. Thus, in the process step of forming an organic EL light emitting layer, contact of an organic EL material with ozone and moisture can be effectively minimized, so that deterioration of the organic EL material in the process step of forming an organic EL light emitting layer can be minimized. Therefore, an organic EL display having high luminous efficiency, long product-life, and high light property can be fabricated.

In a known method, for example, in which an organic EL light emitting layer is formed in a housing including a dry inert gas atmosphere, inflow of outside air into the housing has to be completely restricted. Therefore, very high air tightness is required for the housing in the known method and the housing has to be a globe box having high air tightness or the like. In contrast, according to the present preferred embodiment, an organic EL light emitting layer is formed in an air atmosphere. Thus, inflow of outside air into a housing does not have to be completely restricted and the housing may be, for example, a semi-closed space. Accordingly, compared to the known method, it is easier to carry out an organic EL display from the housing and carry in materials and the like into the housing. Also, workers can easily move in and out. Therefore, according to the present preferred embodiment, high production efficiency (high workability and high transportability) for an organic EL display can be achieved.

Furthermore, the fabrication method of the present preferred embodiment does not need an inert gas (nitrogen, argon, or the like) requiring a high operating cost. Therefore, according to the fabrication method of the present preferred embodiment, an organic EL display can be fabricated at low cost.

A method for generating an adjusted air atmosphere is not particularly limited. For example, an adjusted air atmosphere may be obtained by generating an adjusted air having a lower moisture concentration than that of the ambient atmosphere and a lower ozone concentration than that of the ambient atmosphere using a moisture reducer for reducing a moisture concentration and an ozone reducer for reducing an ozone concentration, and then sending the adjusted air into the housing. Moreover, for example, an adjusted air atmosphere may be obtained by removing at least part of the moisture and ozone in the housing using the moisture reducer and the ozone reducer. Note that the process step (which will be occasionally referred to as an "air sending step") of sending adjusted air into the housing may be continuously performed in a period in which the process step (which will be occasionally referred to as a "formation step") for forming an organic EL light emitting layer is performed. Also, the air sending step may be intermittently performed in a period in which the formation step is performed. For example, a moisture concentration in the housing may be monitored by a moisture sensor (hygrometer) or the like and when the moisture concentration in the housing exceeds a predetermined level, the air sending step may be performed for a predetermined period of time.

The moisture reducer preferably includes at least one of a moisture absorber for absorbing moisture, a moisture remover for cooling down air to remove at least part of the moisture in the air and a moisture remover for compressing air to remove at least part of the moisture in the air. As the moisture absorber for absorbing moisture, a moisture absorbent material or the like can be used. The moisture remover for cooling down air to remove at least part of the moisture in the air can be configured to include, for example, a cooler and a circulating pump. The moisture remover for compressing air to remove at least part of the moisture in the air can be configured to include, for example, a compressor and a circulating pump.

The ozone reducer preferably includes at least one of an ozone decomposer and an ozone absorber. Specifically, an ozone decomposition catalyst, an ozone absorbent material, and the like can be used.

In the method for fabricating an organic EL display according to the present preferred embodiment, a moisture concentration in the housing when an organic electroluminescent light emitting layer is formed is preferably about 5 g/Kg (D.A.) or less. Moreover, the moisture concentration is preferably about 0.18 g/Kg (D.A.) or more. The moisture concentration in the housing when the organic electroluminescent light emitting layer is formed is made to be about 5 g/Kg (D.A.), so that an organic EL display having a high light property can be fabricated.

Likewise, in view of obtaining an organic EL display having a high light property, according to the method for fabricating an organic EL display according to the present preferred embodiment, an ozone concentration in the housing when the organic electroluminescent light emitting layer is formed is preferably about 30 ppb or less.

A fabrication apparatus according to another preferred embodiment the present invention is an apparatus for fabricating an organic electroluminescent display including an organic electroluminescent light emitting layer (for example, a high molecular organic electroluminescent light emitting layer) provided between a pair of electrodes. The fabrication apparatus of the present preferred embodiment includes a housing for forming the organic electroluminescent light emitting layer and an atmosphere adjuster for making, when the organic electroluminescent light emitting layer is formed, an air atmosphere of the housing to have a lower moisture concentration than that of an ambient atmosphere and a lower ozone concentration than that of the ambient atmosphere.

With the fabrication apparatus of the present preferred embodiment, in the process step of forming an organic EL light emitting layer, contact of an organic EL material with ozone and moisture can be minimized, so that deterioration of the organic EL material can be minimized. Therefore, an organic EL display having high luminous efficiency, long production-life, and high light property can be fabricated.

Moreover, for example, with a known fabrication apparatus in which an organic EL layer is formed in a housing having a dry inert gas atmosphere, inflow of outside air into the housing has to be completely restricted. Therefore, very high airtightness is required for the housing in the known apparatus and the housing has to be a globe box having high air tightness or the like. In contrast, according to the present preferred embodiment, an adjusted air atmosphere is kept in a housing. Thus, inflow of outside air into the housing does not have to be completely restricted and the housing may be, for example, a semi-closed space. Accordingly, with the fabrication apparatus of the present preferred embodiment, it is easy to carry out an organic EL display from the housing and carry in materials and the like into the housing. Also, workers can easily move in and out. Therefore, according to the present preferred embodiment, an organic EL display can be fabricated with high production efficiency (high workability and high transportability).

Furthermore, the fabrication apparatus of the present preferred embodiment does not need an inert gas (nitrogen, argon, or the like) requiring a high operating cost. Therefore, with the fabrication apparatus of the present preferred embodiment, an organic EL display can be fabricated at low cost.

The atmosphere adjuster may be provided outside the housing. The atmosphere adjuster may include an adjusted air generator for making adjusted air having a lower moisture concentration than that of the ambient atmosphere and a lower ozone concentration than that of the ambient atmosphere using the moisture reducer and the ozone reducer and an air sending section for sending the adjusted air into the housing. The adjusted air generator may include a moisture reducer for reducing a moisture concentration and an ozone reducer for reducing an ozone concentration.

Moreover, the atmosphere adjuster may be provided in the housing and include a moisture reducer for reducing a moisture concentration in the housing and an ozone reducer for reducing an ozone concentration in the housing.

The moisture reducer preferably includes at least one of a moisture absorber for absorbing moisture, a moisture remover for cooling down air to remove moisture in the air, and a moisture remover for compressing air to remove moisture in the air. As the moisture absorber for absorbing moisture, a moisture absorbent material or the like can be used. The moisture remover for cooling down air to remove at least part of the moisture in the air can be configured to include, for example, a cooler and a circulating pump. The moisture remover for compressing air to remove at least part of the moisture in the air can be configured to include, for example, a compressor and a circulating pump.

The ozone reducer preferably includes at least one of an ozone decomposer and an ozone absorber. Specifically, an ozone decomposition catalyst, an ozone absorbent material, and the like can be used.

In the fabrication apparatus according to the present preferred embodiment, a moisture concentration in the housing when an organic electroluminescent light emitting layer is formed is preferably about 5 g/Kg (D.A.) or less. Moreover, the moisture concentration is preferably about 0.18 g/Kg (D.A.) or more. Thus, an organic EL display having a high light property can be fabricated.

Likewise, in view of obtaining an organic EL display having a high light property, an ozone concentration in the housing when the organic electroluminescent light emitting layer is formed is preferably about 30 ppb or less.

As has been described, according to the preferred embodiments of the present invention, in fabrication process steps, deterioration of an organic EL material contained in an organic EL layer can be effectively controlled. Therefore, an organic EL display having high luminous efficiency and long production-life can be fabricated at low cost and with high production efficiency.

Other features, elements, processes, steps, characteristics and advantages of the present invention will become more apparent from the following detailed description of preferred embodiments of the present invention with reference to the attached drawings.

DETAILED DESCRIPTION OF PREFERRED EMBODIMENTS

Hereafter, preferred embodiments of the present invention will be described with reference to the accompanying drawings.

Figure 1:
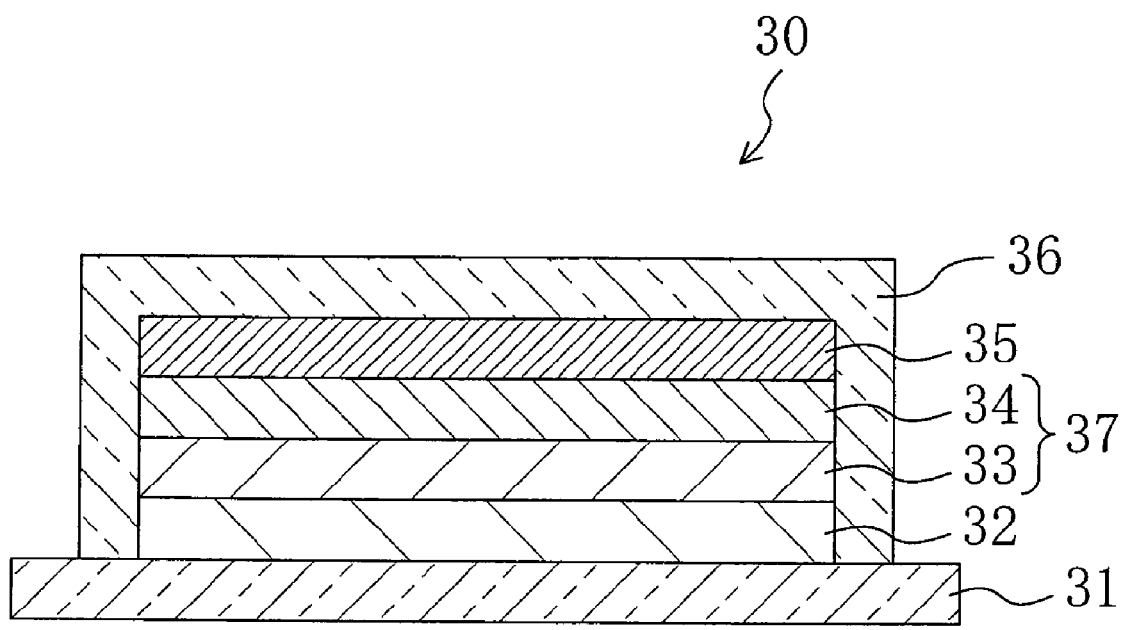
FIG. 1 is a cross-sectional view illustrating a configuration of a main part of an organic EL display according to a preferred embodiment of the present invention.

FIG. 1 is a cross-sectional view illustrating a configuration of a main part of an organic EL display 30 according to a preferred embodiment of the present invention.

As shown in FIG. 1, the organic EL display 30 according to the present preferred embodiment preferably includes an insulating substrate 31 formed of glass, plastic, or the like; a first electrode (anode) 32 provided on the insulating substrate 31; an organic EL layer 37 including a buffer layer 33 and an organic EL light emitting layer 34 provided over the first electrode 32, a second electrode (cathode) 35 provided on the organic EL light emitting layer 34 and a sealing member 36 provided so as to encapsulate the organic EL display 30.

The first electrode 32 can be made of a transparent conductive oxide such as indium tin oxide (ITO), indium zinc oxide (IZO), and the like. The buffer layer 33 may be a charge transport layer and, more specifically, a hole transport layer or a hole injection layer. The buffer layer 33 may be a single layer or a laminated layer. For example, the buffer layer 33 may be a laminated layer of a hole injection layer and a hole transport layer. Moreover, the buffer layer 33 also has the function of flattening a device surface.

In this preferred embodiment, no buffer layer is provided between the organic EL light emitting layer 34 and the second electrode (cathode) 35, but a buffer layer such as an electron transport layer and an electron injection layer may be formed between the organic EL light emitting layer 34 and the second electrode (cathode) 35. As a material for the buffer layer 33, for example, a mixture of polyethylene dioxithiophene and polysulfonic acid (PEDOT/PSS, for example BAYTRON P CH8000 available from H. C. Starck-VTECH Ltd., Poly-TPD (poly(N,N'-bis-(4-butylphenyl)-N,N'-bis(phenyl)benzidine), PANI-CSA, and the like can be used.

The organic EL light emitting layer 34 is a layer for recombining electrons and holes (positive holes) injected from the first electrode 32 and the second electrode 35, respectively, to output light. The organic EL light emitting layer 34 contains an organic EL light emitting material. As the organic EL light emitting material, for example, polyfluorene compound, polyphenylenevinylene compound, polyspiro compound, poly-paraphenylene compound, polythiophene compound, and the like represented by a compound (which will be hereafter occasionally referred to a "compound A") expressed by the following chemical formula can be used.

Chemical formula 1

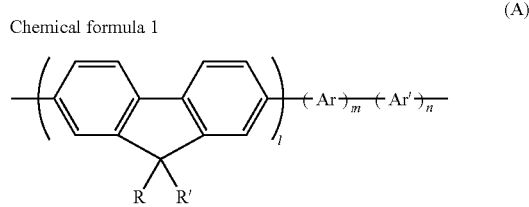

(A)

(Where each of R and R' is an alkyl chain and each of Ar and Ar' is aromatic aryl compound. Each of l and m is an integer number of 1 or more and n is an integer of 0, 1, or more. The molecular weight is about 50,000 or more and about 500,000 or less.)

Note that in Chemical formula 1, the aromatic aryl compound may be dimethylbenzene, pyridine, benzene, anthracene, spirobiflorene, carbazole, benzoamine, bipyridine, benzothiadiazole, or the like. A luminescent color of the compound A varies depending on types of Ar and Ar' and the ratio of l:m:n in Chemical formula 1.

The second electrode 35 can be made of, for example, an alkali metal such as lithium, calcium and the like, alkali earth metal, fluorine of any one of such metals, or the like.

The sealing member 36 has the function of minimizing the inflow of moisture, ozone, and the like into a device and can be made of, for example, glass, plastic, or resin.

Next, respective steps for fabricating the organic EL display 30 of this preferred embodiment will be described in detail with reference to FIGS. 1 and 2.

First, a first electrode 32 is preferably formed of transparent conductive oxide such as indium tin oxide (ITO) and the like on an insulating substrate 31 made of glass, plastic, or the like. The first electrode 32 can be formed by vapor deposition represented by chemical vapor deposition (CVD). Next, an organic EL layer 37 (including a buffer layer 33 and an organic EL light emitting layer 34) is formed by processing steps which will be described later in detail. Note that the organic EL layer 37 can be formed by wet processing, print processing, laser transfer, or the like. Spin coating, inkjetting, nozzle coating, slit coating, die coating, and the like are examples of wet processing. Offset printing and intaglio printing are examples of print processing.

Finally, a second electrode (cathode) 35 is formed on the organic EL light emitting layer 34 and then the obtained lamination structure is encapsulated by a sealing member 36 such as a glass cap and the like in an inert gas atmosphere such as nitrogen or the like. Thus, the organic EL display 30 can be completed.

Next, the process step of forming the organic EL layer 37 (including the organic EL light emitting layer 34 and the buffer layer 33) of this preferred embodiment will be described in detail with reference to FIG. 2.

Figure 2:
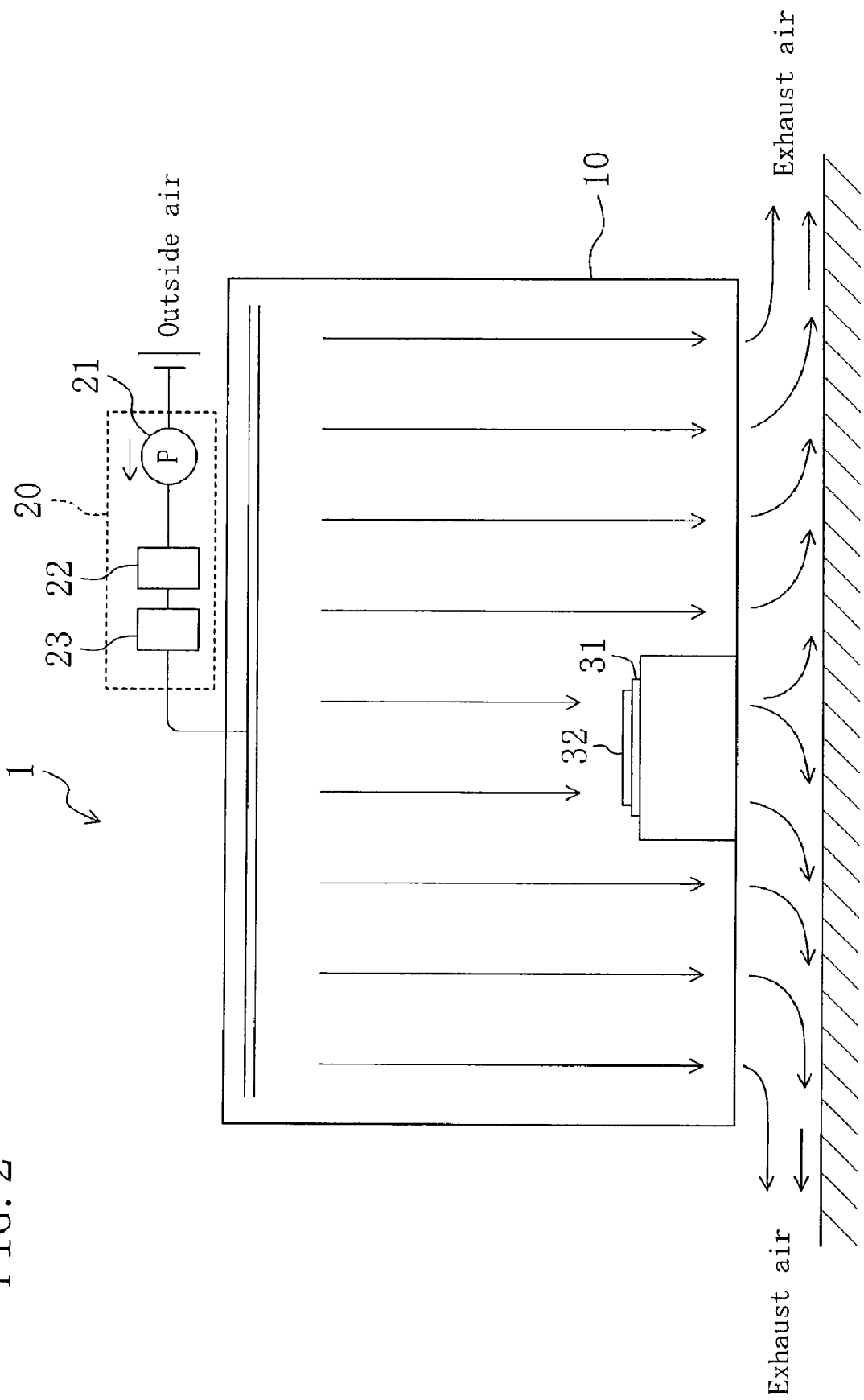
FIG. 2 is a view illustrating a configuration of a fabrication apparatus.

FIG. 2 is a view illustrating a configuration of a fabrication apparatus 1 of this preferred embodiment.

The fabrication apparatus 1 includes a housing 10 for forming the organic EL layer 37 and an atmosphere adjuster 20 connected to the housing 10 by a duct. A platform on which, for example, an insulating substrate 31 including the first electrode 32 formed thereon is provided inside the housing 10.

The atmosphere adjuster 20 includes an adjusted air generator including a pump 21, a moisture reducer 22, and an ozone reducer 23. Note that in this preferred embodiment, the ozone reducer 23 is directly connected to the housing 10 by the duct and the moisture reducer 22 is connected to the housing 10 via the ozone reducer 23. However, the ozone reducer 23 may be directly connected to the housing 10 and the moisture reducer 22 may be connected to the housing 10 via the ozone reducer 23. Moreover, the pump 21 may be provided between the ozone reducer 23 and the housing 10 or between the ozone reducer 23 and the moisture reducer 22. Furthermore, a clean filter for filtering dust, dirt, and the like may be provided between the pump 21 and the moisture reducer 22. With the clean filter provided, inflow of dust, dirt, and the like into the housing 10 can be effectively minimized.

The pump 21 has the function of sending air which has been absorbed, pressurized, and adjusted by the moisture reducer 22 and the ozone reducer 23 to the housing 10. The moisture reducer 22 has the function of reducing a moisture concentration of air sent from the pump 21 and exhausting air having a reduced moisture concentration to the ozone reducer 23. The moisture reducer 22 may include a moisture absorber (for example, a liquid moisture absorbent material, a solid moisture absorbent material, or the like) for absorbing moisture. The moisture reducer 22 may include a cooling-removal section for cooling down air to remove at least part of the moisture in air. For example, the cooling-removal section can be configured to include a cooler (heat exchanger) having the function of cooling intake air to a dew-point temperature or less to condense/remove at least part of the moisture in the air.

Moreover, the moisture reducer 22 may include a compression-removal section for compressing air to remove at least part of the moisture in the air. The compression-removal section may be configured to include, for example, a compressor for taking in outside air and compressing the outside air and reducing a saturated water vapor amount of the air to condense/remove at least part of the moisture in the air.

As a matter of course, the moisture reducer 22 may be formed of a combination of two or more of a moisture absorber, a cooling-removal section, and a compression-removal section. For example, the moisture reducer 22 may be configured to include a compressor for taking in outside air and compressing the outside air and a cooler for cooling down air compressed by the compressor to condense/remove at least part of the moisture in the air.

The ozone reducer 23 has the function of reducing an ozone concentration of air having a reduced moisture concentration by the moisture reducer 22 to adjust the air and exhausting the adjusted air to the housing 10. The ozone reducer 23 can be configured to include an ozone filter having the function of absorbing and/or decomposing ozone to reduce an ozone concentration in the adjusted air. The ozone filter may include an ozone decomposition catalyst and an ozone absorbent material (for example, activated carbon and the like) having the function of absorbing ozone. The ozone filter may include one of an ozone decomposition catalyst and an ozone absorbent material.

As has been described, in the fabrication apparatus 1, a moisture concentration and an ozone concentration adjusted by the moisture reducer 22 and the ozone reducer 23, respectively, are provided into the housing 10. As shown in FIG. 1, adjusted air is sent into the housing 10 through an entire upper surface (ceiling) of the housing 10 and flows toward a bottom surface (floor). The bottom surface (floor) of the housing 10 is grated and the adjusted air flowing toward the bottom surface (floor) is exhausted to the outside of the housing 10 through the bottom surface.

Thus, by the down flow of the adjusted air, dust, dirt, and the like in the housing 10 can be exhausted to the outside of the housing 10 through a bottom surface (floor) of an EL layer formation room. Accordingly, dust, dirt, and the like in the housing 10 can be reduced.

First, the atmosphere adjuster 20 is operated to obtain an adjusted air atmosphere having a lower moisture concentration than that of the ambient atmosphere and a lower ozone concentration than that of the ambient atmosphere. In the adjusted air atmosphere, a buffer layer 33 and an organic EL light emitting layer 34 are formed by wet processing such as an inkjet method and the like. Thus, in the process step of forming an organic EL layer 37, contact of an organic EL material such as an organic EL light emitting material and a charge transport material and the like contained in the buffer layer 33 and the organic EL light emitting layer 34 with ozone and moisture is minimized. Accordingly, deterioration of the organic EL material is minimized. Therefore, the organic EL display 30 having a high light emitting property can be fabricated.

In view of achieving a higher light emitting property, the moisture concentration in the housing 10 is preferably about 5 g/Kg (D.A.) or less and, more preferably, about 3 g/Kg (D.A.). Moreover, the ozone concentration in the housing 10 is preferably about 30 ppb or less. Note that, for example, 5 g/Kg (D.A.) means that 5 g of water is contained in 1 Kg of dry air.

Note that a lower moisture concentration in the housing 10 in the process step of forming the organic EL layer 37 is more preferable. However, the moisture concentration in the housing 10 does not have to be reduced to a level less than about 0.18 g/Kg. With the housing 10 having a moisture concentration of about 0.18 g/Kg, substantially the same effects as those in the case where the organic EL layer 37 is formed in a dry inert gas (for example, nitrogen) atmosphere having substantially no moisture (i.e., a moisture concentration of 0) can be achieved. Moreover, if the ozone concentration in the housing 10 is about 30 ppb or less, substantially the same high light property can be achieved with any ozone concentration. Thus, the ozone concentration in the housing 10 does not have to be completely zero. Therefore, the housing 10 does not have to be a housing in which inflow of outside air must be completely prevented but may be a housing in which inflow of outside air can be minimized, for example, a room blocked from outside air by a wall, a door, or the like. Thus, the fabrication apparatus 1 of this preferred embodiment is relatively less expensive, compared to a known fabrication apparatus which requires a globe box or the like.

Moreover, the organic EL display 30 can be easily carried out from the housing 10 and workers can easily move in and out of the housing 10. Furthermore, unlike the case where the organic EL layer 37 is formed in an inert gas atmosphere, an inert gas such as nitrogen or the like is not needed. Therefore, with the fabrication apparatus 1 of this preferred embodiment, an organic EL display can be fabricated in a simple manner and at low cost.

Note that the atmosphere adjuster 20 may be in an operation state at all times in the process step of forming the organic EL layer 37. However, the moisture concentration and ozone concentration of the air atmosphere in the housing 10 only have to be maintained at a predetermined level or less, and thus the atmosphere adjuster 20 does not have to be in an operation state at all times in the process step of forming the organic EL layer 37. For example, the atmosphere adjuster 20 may be in an operation state before the process step of forming the organic EL layer 37, and the moisture concentration and the ozone concentration in the housing 10 may be monitored by a moisture sensor (hygrometer) and an ozone concentration measuring apparatus or the like in the process step of forming the organic EL layer 37, and then when the moisture concentration and/or the ozone concentration in the housing 10 reach a predetermined value, the atmosphere adjuster 20 may be operated for a predetermined period of time.

For example, when the organic EL layer 37 is formed by wet processing such as an inkjet method or the like, the process step of forming the organic EL layer 37 includes an ink applying step of applying an ink including an organic EL material and a drying step of drying the applied ink. Of these steps, at least the ink applying step is preferably performed in an adjusted air atmosphere (in the housing 10) having a reduced moisture concentration. Furthermore, it is also preferable to perform, after formation of the organic EL layer 37, the step of moving the organic EL layer 37 to a room maintained in a vacuum for the purpose of forming a cathode. Needless to say, all fabrication process steps for fabricating the organic EL display may be performed in the housing 10.

Modified Example

Figure 3:
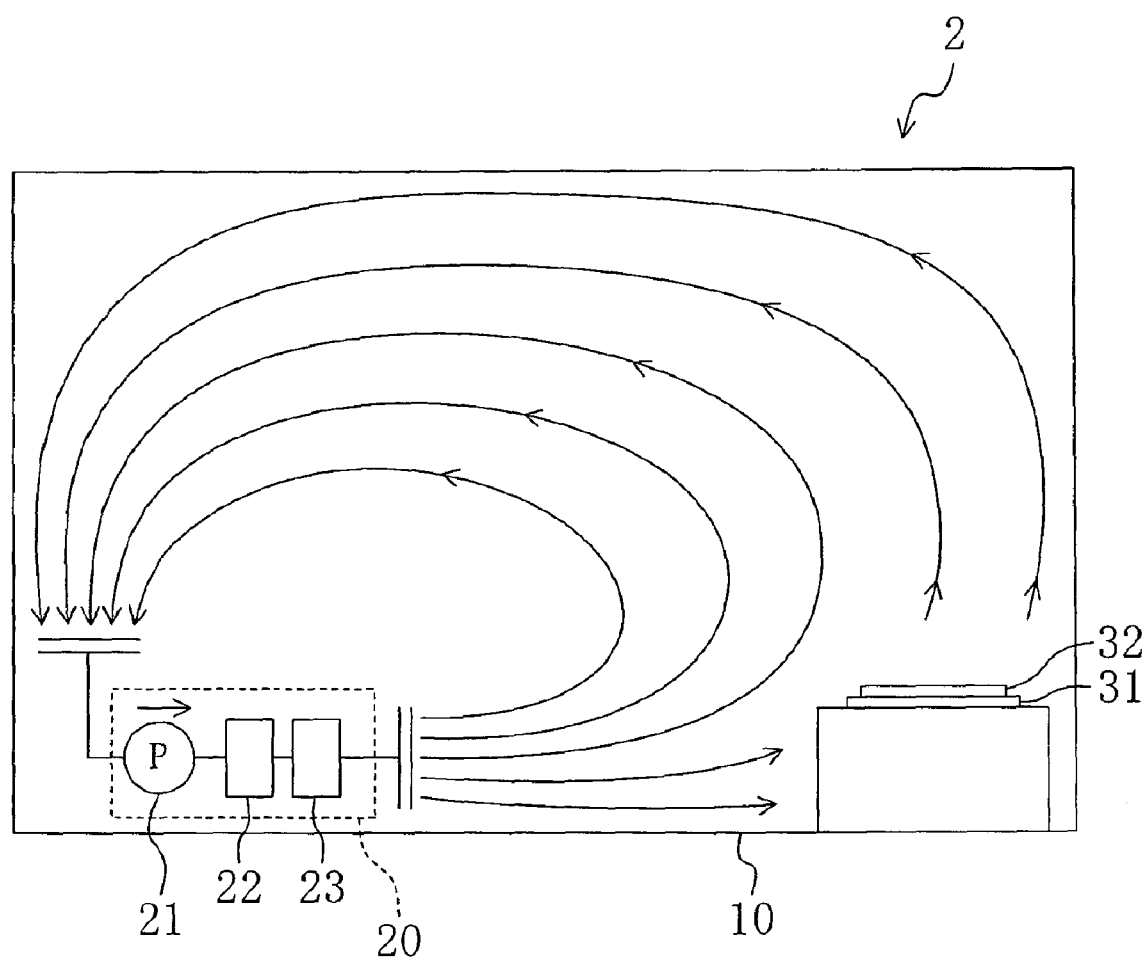
FIG. 3 is a view illustrating a configuration of a fabrication apparatus.

FIG. 3 is a view illustrating a configuration of a fabrication apparatus 2 according to a modified example.

As shown in FIG. 3, the atmosphere adjuster 20 may be placed in the housing 10. In such a case, the atmosphere adjuster 20 absorbs air in the housing 10, reduces the moisture concentration and the ozone concentration of the air and then exhausts the air to the housing 10. That is, the fabrication apparatus 2 of this preferred embodiment has a configuration in which at least part of the moisture and ozone in the housing 10 is removed by the atmosphere adjuster 20. With this configuration, as in the fabrication apparatus 1 of the above-described preferred embodiment, an air atmosphere having a lower moisture concentration than that of the ambient atmosphere and a lower ozone concentration than that of the ambient atmosphere can be achieved in the housing 10.

Note that in the above-described preferred embodiment and the modified example, examples of forming a passive matrix type organic EL display 30 have been described. However, the present invention is not limited to those examples, but can also be applied to an active matrix type organic EL display 30.

Moreover, as shown in the above-described preferred embodiment, all of layers defining the organic EL layer 37 are preferably formed in an adjusted air atmosphere in the housing 10. Of various kinds of organic EL materials, an organic EL light emitting material is most easily deteriorated when in contact with ozone and moisture. Thus, the organic EL light emitting layer 34 of the organic EL layer 37 is preferably formed in an adjusted air atmosphere and, for example, other organic EL layers may be formed in the ambient atmosphere.

Implementation Examples

As implementation examples and comparison examples, organic EL displays having the same configuration as that of the organic EL display 30 of the above-described preferred embodiment shown in FIG. 1 were formed using the fabrication apparatus 1 of FIG. 2. Specifically, organic EL displays were formed according to the following fabrication method in different atmosphere conditions with various different moisture concentrations and ozone concentrations for forming the organic EL light emitting layer 34. The obtained organic EL displays are indicated as Implementation examples 1 through 15 and Comparison examples 1 through 4, respectively. Note that in each of Implementation examples 1 through 15 and Comparison examples 1 through 4, a baking step of baking the organic EL light emitting layer 34 is assumed to be performed in a $N_2$ atmosphere.

First, an anode 32 of indium tin oxide (ITO) was formed on insulating substrate 31 by sputtering. The first electrode (anode) 32 had a thickness of 200 nm.

Using an inkjet method, a buffer layer 33 containing a mixture of polyethylene dioxithiophene and polysulfonic acid (PEDOT/PSS, for example BAYTRON P CH8000 available from H. C. Starck-VTECK Ltd.) was formed on the anode 32. Specifically, in each of Implementation examples 1 through 5 and Comparison example 1, an ink for forming the buffer layer 33 had a composition containing 6 wt part of PEDOT/PSS, 5 wt part of water, 5 wt part of ethanol, and 5 wt part of ethylene glycol. In each of Implementation examples 6 through 11 and Comparison example 2, the ink had a composition containing 6 wt part of PEDOT/PSS, 5 wt part of water, and 9 wt part of ethanol. Moreover, in each of Implementation examples 12 through 15 and Comparison examples 3 and 4, the ink had a composition containing 6 wt part of PEDOT/PSS and 4 wt part of water.

A film of an ink containing PEDOT/PSS was formed, and then the ink film was baked at 200° C. for 10 minutes, thereby forming a buffer layer 33. In each of Implementation examples 1 through 11 and Comparison examples 1 and 2, the buffer layer 33 had a thickness of 60 nm. In each of Implementation examples 12 through 15 and Comparison examples 3 and 4, the buffer layer 33 had a thickness of 50 nm.

An organic EL light emitting layer 34 containing various light emitting materials was formed on the buffer layer 33 using spin coating. Specifically, in each of Implementation examples 1 through 5 and Comparison example 1, a blue high molecular light emitting material (material for outputting blue light) expressed by Chemical formula 1 was used. In each of Implementation examples 6 through 11 and Comparison example 2, a red high molecular light emitting material (material for outputting red light) was used. In each of Implementation examples 12 through 15 and Comparison examples 3 and 4, a green high molecular light emitting material (a material for outputting green light) was used.

Moreover, in each of Implementation examples 1 through 5 and Comparison example 1, an ink for forming the organic EL light emitting layer 34 had a composition of 8 wt part of the blue high molecular light emitting material, 500 wt part of tetraphosphorus, and 500 wt part of xylene. In each of Implementation examples 6 through 11 and Comparison example 2, the ink had a composition of 1 wt part of the red high molecular light emitting material, 50 wt part of mesitylene, and 50 wt part of xylene. In each of Implementation examples 12 through 15 and Comparison examples 3 and 4, the ink had a composition of 1 wt part of the green high molecular light emitting material and 100 wt part of xylene.

After application of the ink, baking was performed to form an organic EL light emitting layer 34. Specifically, in each of Implementation examples 1 through 11 and Comparison examples 1 and 2, baking was performed at 150° C. for 10 minutes. In each of Implementation examples 12 through 15 and Comparison examples 3 and 4, baking was performed at 200° C. for 60 minutes.

In each of Implementation examples 1 through 5 and Comparison example 1, the organic EL light emitting layer 34 had a thickness of 100 nm. In each of Implementation examples 6 through 11 and Comparison example 2, the organic EL light emitting layer 34 had a thickness of 80 nm. In each of Implementation examples 12 through 15 and Comparison examples 3 and 4, the organic EL light emitting layer 34 had a thickness of 70 nm.

A barium layer having a thickness of 5 nm and an aluminum layer having a thickness of 100 nm were formed on the organic EL light emitting layer 34 by vacuum vapor deposition, thereby forming a second electrode (cathode) 35. Thereafter, in a nitrogen atmosphere, the insulating substrate 31 was sealed by a sealing member (sealing cap) 36 made of glass (available from Asahi Glass Company), thereby completing an organic EL display. The insulating substrate 31 and the sealing material (sealing cap) 36 were adhered with a UV curable resin.

In each of Implementation examples 1 through 15 and Comparison examples 1 and 2, the buffer layer 33 was formed in the ambient atmosphere and the organic EL light emitting layer 34 was formed in an adjusted air atmosphere adjusted to have a predetermined moisture concentration/ozone concentration. Specifically, in each of Implementation examples 1 through 15, the housing 10 was set to have an air atmosphere having a lower ozone concentration than that of the ambient atmosphere and a lower moisture concentration than that of the ambient atmosphere. In Comparison example 1, an adjusted air atmosphere having the same ozone concentration as that of the ambient atmosphere and a lower moisture concentration than that of the ambient atmosphere was used. In Comparison example 2, an adjusted air atmosphere having the same moisture concentration as that of the ambient atmosphere and a lower ozone concentration than that of the ambient atmosphere was used.

In each of Implementation examples 1 through 15 and Comparison examples 1 and 2, a moisture concentration was adjusted using a dry-type dehumidifier moisture removing apparatus (Honey Dry available from Daikin Industries, Ltd.). Moreover, an ozone concentration was adjusted by changing a thickness of an ozone filter.

In Comparison example 3, the buffer layer 33 was formed in the ambient atmosphere and the organic EL light emitting layer 34 was formed in a globe box filled with dry nitrogen (i.e., in a nitrogen atmosphere which substantially does not contain ozone and moisture).

In Comparison example 4, both of the buffer layer 33 and the organic EL layer 37 were formed in the ambient atmosphere of which a moisture concentration and an ozone concentration were not adjusted.

For organic EL displays according to Implementation examples 1 through 15 and Comparison examples 1 through 4 fabricated in the above-described manner, luminous efficiency and brightness half-life were measured. Measurements were performed using an organic EL property measuring device available from Otsuka Electronics Co., Ltd. Note that in Implementation examples 1 through 5 and Comparison example 1 in which a blue high molecular light emitting material was used, luminous efficiency at 200 $cd/m^2$ was measured. In Implementation examples 6 through 11 and Comparison example 2 in which a red high molecular light emitting material was used, luminous efficiency at 500 $cd/m^2$ was measured. In Implementation examples 12 through 15 and Comparison examples 3 and 4 in which a green high molecular light emitting material was used, luminous efficiency at 1000 cd/m² was measured.

Brightness half-life was measured using an organic EL age measuring device available from Otsuka Electronics Co., Ltd. Note that "brightness half-life" means a time which it takes for a brightness at an initial stage to become half of the initial brightness. In each of Implementation examples 1 through 5 and Comparison example 1 in which a blue high molecular light emitting material was used, measurement was performed with an initial brightness of 1500 cd/m². In each of Implementation examples 6 through 11 and Comparison example 2 in which a red high molecular light emitting material was used, measurement was performed with an initial brightness of 3000 cd/m². In each of Implementation examples 12 through 15 and Comparison examples 3 and 4 in which a green high molecular light emitting material was used, measurement was performed with an initial brightness of 8000 cd/m².

Table 1 below shows moisture concentrations (at an absolute humidity), ozone concentrations, luminous efficiency, and brightness half-life for the implementation examples and the comparison examples.

Figure 4:
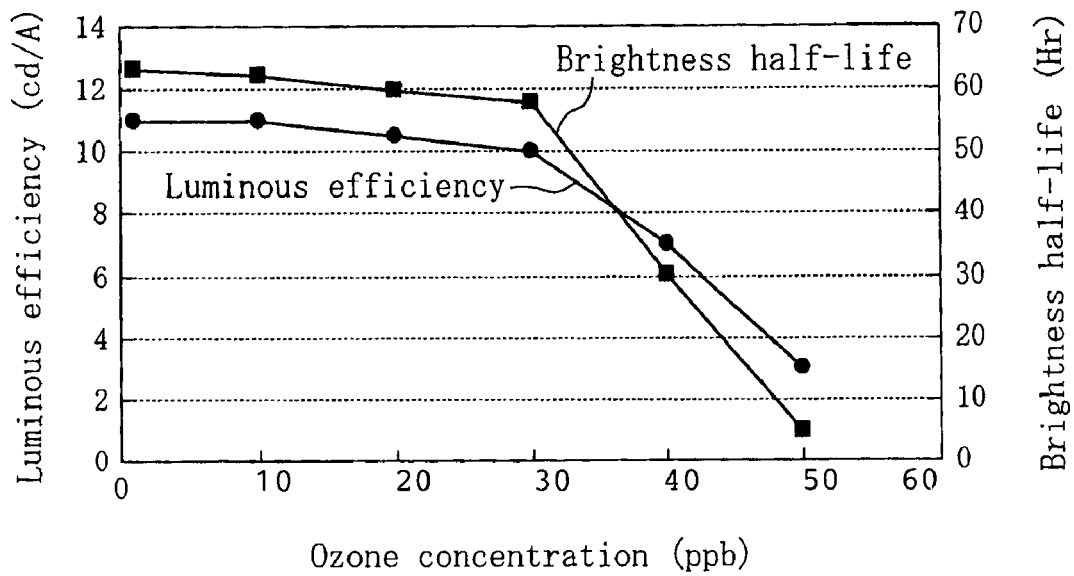
FIG. 4 is a graph showing the relationship between an ozone concentration in a housing and luminous efficiency/brightness half-life of an obtained organic EL display for Implementation examples 1 through 5 and Comparison example 1.

FIG. 4 is a graph showing the relationship between an ozone concentration in the housing 10 and luminous efficiency/brightness half-life of an obtained organic EL display for Implementation examples 1 through 5 and Comparison example 1 in which a blue high molecular light emitting material was used.

Figure 5:
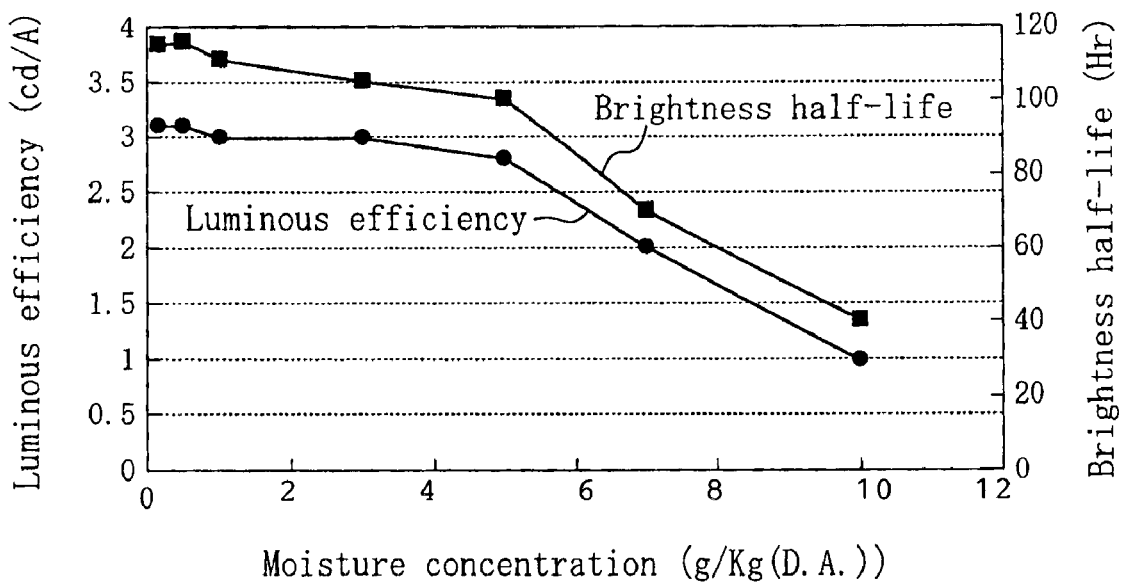
FIG. 5 is a graph showing the relationship between an ozone concentration in a housing and luminous efficiency/brightness half-life of an obtained organic EL display for Implementation examples 6 through 11 and Comparison example 2.

FIG. 5 is a graph showing the relationship between a moisture concentration in the housing 10 and luminous efficiency/brightness half-life of an obtained organic EL display for Implementation examples 6 through 11 and Comparison example 2 in which a red high molecular light emitting material was used.

As shown in Table 1 and FIG. 4, in Comparison example 1 in which the organic EL light emitting layer 34 was formed in the housing 10 having a lower moisture concentration than that of the ambient atmosphere but having the same ozone concentration as that of the ambient atmosphere, both of the luminous efficiency and the brightness half-life were low. In contrast, as results for Implementation examples 1 through 5 show, when the moisture concentration in the housing 10 was adjusted to be lower than that of the ambient atmosphere and the ozone concentration was also adjusted to be lower than

TABLE 1

| | Light emitting material | Ozone concentration (ppb) | Moisture concentration (g/Kg(D.A.)) | Atmosphere | Luminous efficiency (cd/A) | Brightness half-life (Hr) |
|---|---|---|---|---|---|---|
| Implementation Example 1 | Blue | <3 | 0.5 | Air | 11 | 63 |
| Implementation Example 2 | Blue | 10 | 0.5 | Air | 11 | 62 |
| Implementation Example 3 | Blue | 20 | 0.5 | Air | 10.5 | 60 |
| Implementation Example 4 | Blue | 30 | 0.5 | Air | 10 | 58 |
| Implementation Example 5 | Blue | 40 | 0.5 | Air | 7 | 30 |
| Comparison Example 1 | Blue | 50 | 0.5 | Air | 3 | 5 |
| Implementation Example 6 | Red | <3 | 0.18 | Air | 3.1 | 115 |
| Implementation Example 7 | Red | <3 | 0.5 | Air | 3.1 | 116 |
| Implementation Example 8 | Red | <3 | 1 | Air | 3 | 111 |
| Implementation Example 9 | Red | <3 | 3 | Air | 3 | 105 |
| Implementation Example 10 | Red | <3 | 5 | Air | 2.8 | 100 |
| Implementation Example 11 | Red | <3 | 7 | Air | 2 | 70 |
| Comparison Example 2 | Red | <3 | 10 | Air | 1 | 40 |
| Implementation Example 12 | Green | <3 | 0.01 | Air | 14.5 | 155 |
| Implementation Example 13 | Green | <3 | 0.18 | Air | 14.3 | 156 |
| Implementation Example 14 | Green | 10 | 0.5 | Air | 14 | 150 |
| Implementation Example 15 | Green | 30 | 5 | Air | 13.5 | 140 |
| Comparison Example 3 | Green | 0 | 0.01 | Air | 12.5 | 155 |
| Comparison Example 4 | Green | 50 | 10 | Air | 5 | 30 | that of the ambient atmosphere, a luminous efficiency equal to or larger than twice as large as that of Comparison example 1 and a brightness half-life equal to or larger than six times as large as that of Comparison example 1 were obtained. This shows that sufficiently high luminous efficiency and brightness half-life cannot be achieved by reducing only the moisture concentration to a lower level than that of the ambient atmosphere but sufficiently high luminous efficiency and brightness half-life can be achieved by reducing each of the moisture concentration and the ozone concentration to a lower level than those of the ambient atmosphere.

As shown in FIG. 4, the luminous efficiency and the brightness half-life were largely changed when the ozone concentration was in the range from about 30 ppb to about 50 ppb and were hardly changed when the ozone concentration was about 30 ppb or less. In other words, it has been found that when the ozone concentration is about 30 ppb or less, high luminous efficiency and brightness half-life can be achieved.

Moreover, as shown in Table 1 and FIG. 5, in Comparison example 2 in which the organic EL light emitting layer 34 was formed in the housing 10 having a lower ozone concentration than that of the ambient atmosphere and the same moisture concentration as that of the ambient atmosphere, both of the luminous efficiency and the brightness half-life were low. In contrast, when the ozone concentration in the housing 10 was adjusted so as to be lower than that of the ambient atmosphere and also the moisture concentration in the housing 10 was adjusted to be lower than that of the ambient atmosphere, as results for Implementation examples 6 through 11 show, a luminous efficiency equal to or larger than twice as large as that of Comparison example 2 and a brightness half-life equal to or larger than 1.75 times as large as that of Comparison example 2. This shows that sufficiently high luminous efficiency and brightness half-life cannot be achieved by reducing only the ozone concentration to a lower level than that of the ambient atmosphere but sufficiently high luminous efficiency and brightness half-life can be achieved by reducing each of the moisture concentration and the ozone concentration to a lower level than those of the ambient atmosphere.

As shown in FIG. 5, the luminous efficiency and the brightness half-life were largely changed when the moisture concentration was in the range of more than about 5 g/Kg (D.A.) and were hardly changed when the moisture concentration was in the range of about 5 g/Kg (D.A.) or less. In other words, it has been found that when the moisture concentration is about 5 g/Kg (D.A.) or less, particularly high luminous efficiency and brightness half-life can be achieved.

Next, with focus on results for Implementation examples 12 through 15 and Comparison example 4, it has been discovered that in the same manner as the results for Implementation examples 1 through 11 and Comparison examples 1 and 2 show, high luminous efficiency and brightness half-life can be achieved by reducing the ozone concentration and the moisture concentration in the housing 10.

Comparison between results for Implementation examples 12 and 13 in which the organic EL light emitting layer 34 was formed in the housing 10 having an ozone concentration of about 3 ppb or less and a moisture concentration of about 0.18 g/Kg (D.A.) or less and results for Comparison example 3 in which the organic EL light emitting layer 34 was formed in a nitride atmosphere in which substantially ozone and moisture were not contained shows that substantially the same luminous efficiency and brightness half-life were measured for all of those implementation examples and comparison example. This shows that the organic EL light emitting layer 34 does not have to be formed in an atmosphere in which substantially ozone and moisture are not contained but may be formed in an atmosphere having certain amounts of moisture and ozone. Considering that, compared to housings used in Implementation examples 12 and 13, a globe box used in Comparison example 3 is very expensive (for example, a globe box costs five times as much as the housings of the present invention) and workability in the globe box is low, it is more preferable to form the organic EL light emitting layer 34 in an atmosphere having a certain level of moisture concentration. Specifically, it has been found that there is less need for reducing the moisture concentration to a level lower than about 0.18 g/Kg (D.A.).

Moreover, from the results for Comparison example 3 in which the organic EL light emitting layer 34 was formed in a nitride atmosphere and Implementation examples 12 and 13 in which the organic EL light emitting layer 34 was formed in an adjusted air atmosphere, it has been found that an organic EL material is not so deteriorated due to contact with oxygen.

From the above-described results, it has been found that it is particularly preferable to form the organic EL light emitting layer 34 in an adjusted air atmosphere having a moisture concentration of about 0.18 g/Kg (D.A.) or more and about 5 g/Kg (D.A.) or less and an ozone concentration of about 30 ppb or less.

As has been described, according to a method for fabricating an organic EL display according to preferred embodiments of the present invention, an organic EL display having a long life can be fabricated. Therefore, the inventive fabrication method is useful for a cellular phone, a PDA, a TV, an electric book, a monitor, an electric poster, a watch, an electric inventory tag, an emergency guidance device, and the like.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for fabricating an organic electroluminescent display including an organic electroluminescent light emitting layer provided between a pair of electrodes, the method comprising the step of:
    forming the organic electroluminescent light emitting layer in a housing including an air atmosphere having a lower moisture concentration than that of an ambient atmosphere and a lower ozone concentration than that of the ambient atmosphere.

2. The method of claim 1, further comprising the step of adjusting the air atmosphere of the housing so that the air atmosphere has a lower moisture concentration than that of the ambient atmosphere from which an adjusted air is generated using a moisture reducer arranged to reduce a moisture concentration and an ozone reducer arranged to reduce an ozone concentration, and has a lower ozone concentration than that of the ambient atmosphere by sending the adjusted air having a lower moisture concentration than that of the ambient atmosphere and a lower ozone concentration than that of the ambient atmosphere into the housing; wherein
    the moisture reducer includes at least one of a moisture absorber arranged to absorb moisture, a moisture remover arranged to cool down air to remove at least a portion of the moisture in the air, and a moisture remover arranged to compress air to remove at least a portion of the moisture in the air.

3. The method of claim 1, further comprising: the step of adjusting the air atmosphere of the housing so that the air atmosphere has a lower moisture concentration than that of the ambient atmosphere from which an adjusted air is generated using a moisture reducer arranged to reduce a moisture concentration and an ozone reducer arranged to reduce an ozone concentration, and has a lower ozone concentration than that of the ambient atmosphere by sending the adjusted air having a lower moisture concentration than that of the ambient atmosphere and a lower ozone concentration than that of the ambient atmosphere into the housing; wherein the ozone reducer includes at least one of an ozone decomposer and an ozone absorber.

4. The method of claim 1, further comprising a step of removing at least a portion of the moisture and at least a portion of the ozone in the housing to adjust the air atmosphere of the housing so as to have a lower moisture concentration than that of the ambient atmosphere and a lower ozone concentration than that of the ambient atmosphere.

5. The method of claim 4, wherein the step of removing said at least a portion of the moisture and said at least a portion of the ozone in the housing is performed using a moisture reducer arranged to reduce a moisture concentration and an ozone reducer arranged to reduce an ozone concentration; wherein the moisture reducer includes at least one of a moisture absorber arranged to absorb moisture, a moisture remover arranged to cool down air to remove said at least a portion of the moisture in the air, and a moisture remover arranged to compress air to remove said at least a portion of the moisture in the air.

6. The method of claim 4, wherein the step of removing said at least a portion of the moisture and said at least a portion of the ozone in the housing is performed using a moisture reducer arranged to reduce a moisture concentration and an ozone reducer arranged to reduce an ozone concentration; wherein the ozone reducer includes at least one of an ozone decomposer and an ozone absorber.

7. The method of claim 1, wherein the moisture concentration in the housing when the organic electroluminescent light emitting layer is formed is about 5 g/Kg or less.

8. The method of claim 7, wherein the moisture concentration in the housing when the organic electroluminescent light emitting layer is formed is about 0.18 g/Kg or more.

9. The method of claim 1, wherein the ozone concentration in the housing when the organic electroluminescent light emitting layer is formed is about 30 ppb or less.

10. A fabrication apparatus for fabricating an organic electroluminescent display including an organic electroluminescent light emitting layer provided between a pair of electrodes, the apparatus comprising:

a housing provided to form the organic electroluminescent light emitting layer; and an atmosphere adjuster arranged to make, when the organic electroluminescent light emitting layer is formed, an air atmosphere of the housing to have a lower moisture concentration than that of an ambient atmosphere and a lower ozone concentration than that of the ambient atmosphere.

11. The fabrication apparatus of claim 10, wherein the atmosphere adjuster is provided in the housing and includes a moisture reducer arranged to reduce the moisture concentration in the housing and an ozone reducer arranged to reduce an ozone concentration in the housing.

12. The fabrication apparatus of claim 11, wherein the moisture reducer includes at least one of a moisture absorber arranged to absorb moisture, a moisture remover arranged to cool down air to remove moisture in the air, and a moisture remover arranged to compress air to remove moisture in the air.

13. The fabrication apparatus of claim 11, wherein the ozone reducer includes at least one of an ozone decomposer and an ozone absorber.

14. The fabrication apparatus of claim 10, wherein
the atmosphere adjuster is provided outside the housing;
the atmosphere adjuster includes an adjusted air generator including a moisture reducer arranged to reduce a moisture concentration and an ozone reducer arranged to reduce an ozone concentration, arranged to make adjusted air having a lower moisture concentration than that of the ambient atmosphere and a lower ozone concentration than that of the ambient atmosphere using the moisture reducer and the ozone reducer, and an air sending section arranged to send the adjusted air into the housing; and
the moisture reducer includes at least one of a moisture absorber arranged to absorb moisture, a moisture remover arranged to cool down air to remove moisture in the air, and a moisture remover arranged to compress air to remove moisture in the air.

15. The fabrication apparatus of claim 10, wherein
the atmosphere adjuster is provided outside the housing;
the atmosphere adjuster includes an adjusted air generator including a moisture reducer arranged to reduce a moisture concentration and a ozone reducer arranged to reduce an ozone concentration, arranged to make adjusted air having a lower moisture concentration than that of the ambient atmosphere and a lower ozone concentration than that of the ambient atmosphere using the moisture reducer and the ozone reducer, and an air sending section arranged to send the adjusted air into the housing; and
the ozone reducer includes at least one of an ozone decomposer and an ozone absorber.

16. The fabrication apparatus of claim 10, wherein the moisture concentration in the housing when the organic electroluminescent light emitting layer is formed is about 5 g/Kg or less.

17. The fabrication apparatus of claim 16, wherein the moisture concentration in the housing when the organic electroluminescent light emitting layer is formed is about 0.18 g/Kg or more.

18. The fabrication apparatus of claim 10, wherein an ozone concentration in the housing when the organic electroluminescent light emitting layer is formed is about 30 ppb or less.

* * * * *